INVENTOR
Allen L. Limberg

BY Kenneth R. Schaef.
ATTORNEY

INVENTOR
Allen L. Limberg
BY Kenneth R. Schaefer
ATTORNEY

United States Patent Office 3,564,438

Patented Feb. 16, 1971

3,564,438

SIGNAL TRANSLATING CIRCUIT HAVING FIRST AND SECOND PAIRS OF SEMICONDUCTOR DEVICES WITH MATCHING CONDUCTION CHARACTERISTICS

Allen L. Limberg, Somerville, N.J., assignor to RCA Corporation, a corporation of Delaware Filed Mar. 3, 1969, Ser. No. 803,804
Int. Cl. H03f 3/68
U.S. Cl. 330—30 11 Claims

ABSTRACT OF THE DISCLOSURE

A signal translating circuit particularly well suited for fabrication as an integrated circuit which provides an output signal representative of a difference between two input signals, the output signal being referenced to a predetermined direct voltage level substantially independent of the direct voltage levels of the input signals. First and second pairs of semiconductor devices, the devices in each pair having matched conduction characteristics, are supplied with first and second input signals. The first input signal is coupled by an impedance to a junction between the first and second devices of the first pair and the second device of the second pair. The second input signal is coupled by a further impedance to a junction between the first and second devices of the second pair. An output signal which is a function of the difference between the input signals is derived across an output impedance coupled to the first device of the first pair.

This invention relates to signal transulating circuits and, more particularly, to amplifying circuits arranged to povide an output signal representative of the difference between two input signals, the output signal being referenced to a predetermined desired direct voltage level which may be selected independently of the direct voltage levels of the input signals.

This invention is particularly well suited for use in integrated circuits, a term which is used herein to describe a unitary or monolithic semiconductor structure or "chip" incorporating the equivalent of a network of interconnected active and passive electrical circuit elements (e.g. transistors, diodes, resistors, capacitors).

A frequent requirement for signal translating stages is that of adding or subtracting two input signals or components of input signals so as to produce their sum or difference, as the case may be. A particular need for providing an output signal which is representative of the difference between two input signal components arises when a plurality of direct coupled amplifier stages are employed and it is desired to remove an undesired direct voltage component, leaving the desired signal voltage component referenced to a direct voltage other than the aforementioned undesired direct voltage component. Specifically, in the design of amplifier circuits employing semiconductor devices, and particularly those constructed as integrated circuits, limited output voltage variations may be obtained. It is therefore desirable, where an object of an amplifier is to produce a varying signal voltage as its output, to provide an input signal wherein the direct voltage level and signal variations about that level are so related to each other and to the gain of the amplifier as to produce a peak to peak output voltage variation approximately equal to the available direct supply voltage (B+).

In circuits employing discrete components (i.e. non-integrated circuits), coupling capacitors frequently are used to remove direct voltage components and thereby permit level setting of signals between signal processing stages. However, such capacitors generally cannot be fabricated on integrated circuit chips and therefore require the uneconomical and undesirable use of an "outboard" discrete component and one or more connecting terminals of the chip.

One method of providing level shift or level setting in direct coupled integrated circuits is described in a copending U.S. patent application, Ser. No. 772,245, entitled "Signal Translating Stage," filed Oct. 31, 1968, now abandoned, in the name of Steven Steckler which is a continuation-in-part of U.S. patent application, Ser. No. 691,884, filed Dec. 19, 1967, now abandoned, both of which are assigned to the same assignee as the present invention.

In some uses of such level setting circuits, a situation may be encountered wherein an output from a given signal processing stage includes an undesired direct component which exceeds the desired varying signal component. In that case, use of a single level setting stage of the type described in the above-identified application is not sufficient to provide the desirable result of a peak to peak output voltage variation approximately equal to the available operating direct supply voltage.

In accordance with one aspect of the present invention, a signal translating stage for removing undesired components from an input signal comprises first and second pairs of semiconductor devices wherein each pair comprises first and second devices having substantially proportionally related conduction characteristics. Each first device has first, second and third electrodes and each second device has at least first and second electrodes. Input signals including desired and undesired components are coupled via a first impedance to the second electrodes of each device of the first pair and to the third electrode of the first device of the second pair. At least a portion of the input signals including the undesired component are coupled via a second impedance to the second electrodes of each device of the second pair. The first electrodes of the devices in each pair are coupled together. A source of energizing voltage is coupled by means of an output impedance to the third electrode of the first device of the first pair. Output signals including the desired component but excluding the undesired component are developed at the output impedance.

In accordance with a further aspect of the invention, a signal translating stage for subtractively combining first and second input signals comprises first and second pairs of semiconductor devices as set forth above. First input signals are coupled via a first impedance to the second electrodes of each device of the first pair and the third electrodes of the first device of the second pair while the second input signals are coupled via a second impedance to the second electrodes of each device of the second pair. A source of energizing voltage is coupled by means of an output impedance to the third electrode of the first device of the first pair. Output signals which are a function of the difference between the input signals and are referenced to a direct voltage level determined by the energizing voltage are developed at the output impedance.

For a better understanding of the present invention and objects and advantages thereof, reference is made to the following description in conjunction with the attached drawing wherein.

Figures 2, 3:
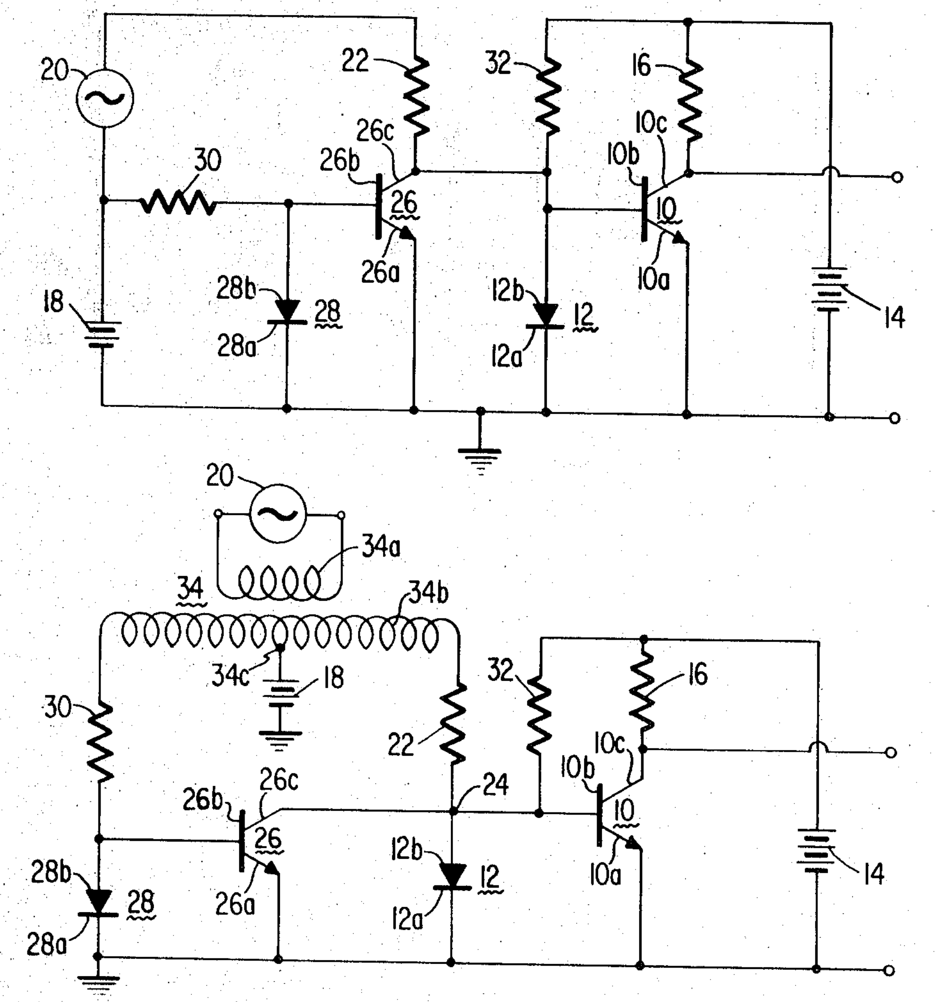
FIG. 2 is a schematic diagram of the circuit of FIG. 1 employing a modified biasing arrangement.
Figure 4:
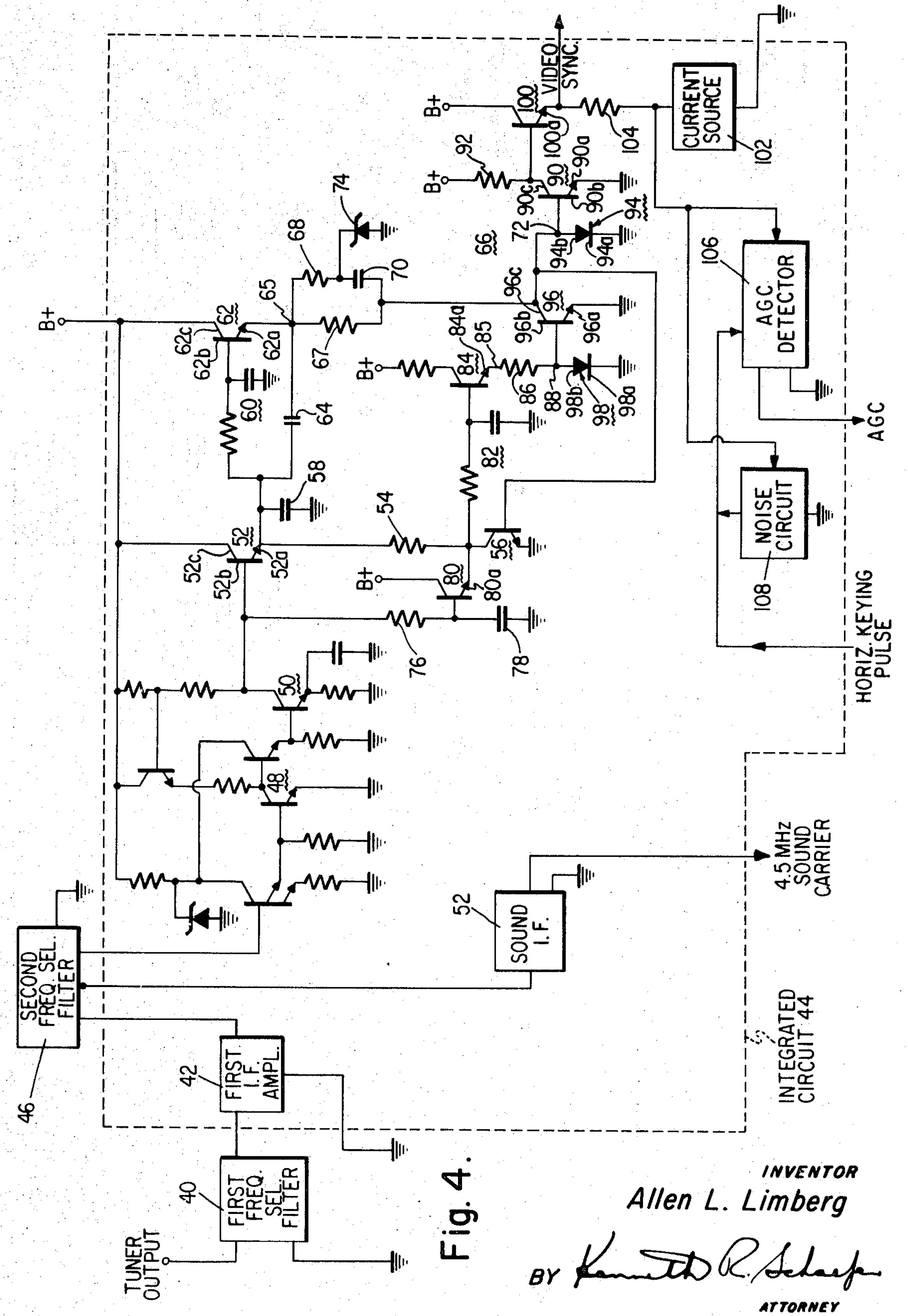

FIG. 3 is a schematic diagram of a signal translating circuit embodying the invention wherein first and second signal components are subtractively combined (e.g. push-pull input signal components); and FIG. 4 is a schematic diagram of a portion of an integrated circuit for use in a television receiver for which the present invention is particularly suited, the integrated circuit providing the functions of intermediate frequency amplification, video detection, video amplification, sound amplification and automatic gain control.

Figure 1:
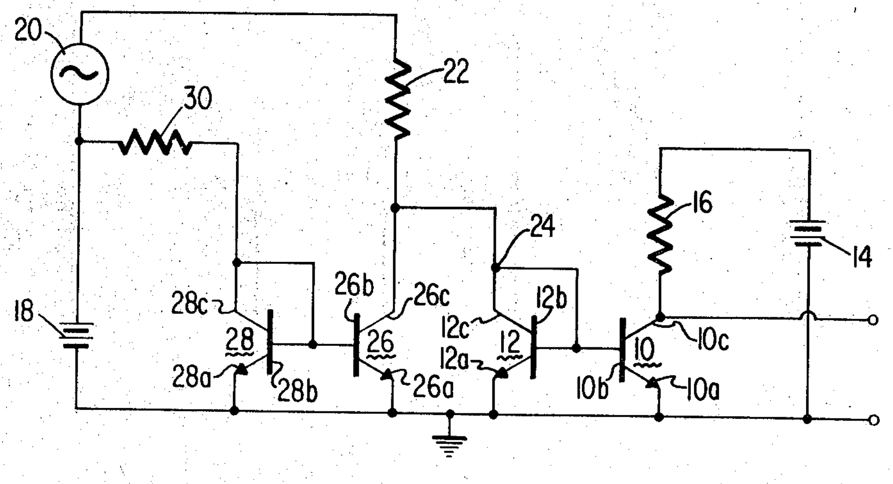
FIG. 1 is a schematic diagram of a signal translating circuit embodying the present invention.

Referring to FIG. 1 of the drawing, the illustrated signal translating stage comprises a first semiconductor device shown as a transistor 10 having emitter, base and collector electrodes 10*a*, 10*b* and 10*c*, respectively. A second semiconductor device connected as a diode 12 is coupled to the input electrodes 10*a*, 10*b* of transistor 10. Diode 12 preferably is fabricated exactly the same as transistor 10 and comprises an emitter electrode 12*a*, a base electrode 12*b* and a collector electrode 12*c* which is directly connected to base electrode 12*b*. For convenience in explanation, diode 12 will be referred to as comprising emitter electrode 12*a* and base electrode 12*b*. Emitter electrode 12*a* is directly connected to emitter electrode 10*a* and base electrode 12*b* is directly connected to base electrode 10*b*. A source of direct energizing voltage 14 is coupled by means of a resistor 16 between a point of reference voltage (ground) and collector electrode 10*c*. The emitter electrodes 10*a* and 12*a* also are connected directly to ground.

A source of input signals including a first relatively nonvarying, direct voltage component (diagrammatically illustrated as a direct voltage supply or battery 18) and a second, varying signal voltage component (diagrammatically illustrated as a signal source 20) is coupled by means of a resistor 22 to the junction 24 of base electrode 10*b* and base electrode 12*b*.

A second circuit combination of third and fourth semiconductor devices comprising a transistor 26 and a diode 28 is coupled to the input sources 18, 20 and to the input circuit 10*a*, 10*b* of transistor 10. Specifically, transistor 26 comprises an emitter electrode 26*a* connected to ground, a base electrode 26*b* coupled by means of a resistor 30 to the junction of battery 18 and signal source 20 and a collector electrode 26*c* connected to the junction between base electrodes 10*b* and 12*b*. The diode 28 is constructed in the same manner as transistor 26 and comprises an emitter electrode 28*a* connected to emitter electrode 26*a* and a base electrode 28*b* connected to the junction of resistor 30 and base electrode 26*b*. As noted in connection with diode 12, diode 28 also includes a collector electrode 28*c* directly connected to base electrode 26*b*.

The characteristics of diodes 12 and 28 are closely matched respectively to the characteristics of the transistors 10 and 26. In an integrated circuit structure, where the four devices are constructed simultaneously and in close proximity to one another on a single chip the conduction characteristics of all four devices will be substantially identical.

That is, for a given base-emitter voltage applied to one pair (diode and transistor) of the devices, equal emitter current densities are produced in each device. It should also be recognized that where the junction areas are unequal, proportional rather than equal emitter currents will be produced in the two devices for a given input. The following explanation will relate to the condition of equal currents in two devices for a pair of illustrative purposes.

The operation of the circuit of FIG. 1 will be described by first considering the circuit which would be formed if the connection from collector electrode 26*c* to junction point 24 as well as the connection from resistor 30 to the junction point between sources 18 and 20 were severed, that is transistor 26 and diode 28 are removed from the circuit. The operation of such a circuit is described in detail in the above-identified U.S. patent application Ser. No. 772,245. In such a circuit, where transistor 10 and diode 12 produce equal emiter currents as well as equal emitter current densities for a given input voltage, the voltage gain of the circuit, both for alternating and direct input voltage components, is equal to the ratio of resistances $R_{16}/R_{22}$. Where it is desired to linearly reproduce an input voltage at the output (collector electrode 10*c*) of the configuration, the ratio $R_{16}/R_{22}$ is selected so that the maximum input voltage provided by the combined source 18, 20 (direct voltage component plus maximum positive-going varying signal voltage component) multiplied by the selected gain is not greater than the voltage provided by source 14. That is, the gain must be selected to prevent "bottoming" at the output electrode 10*c* of transistor 10 when maximum input signal is applied. A further constraint on the gain is related to the fact that the minimum input voltage provided by the combined source 18, 20 (direct voltage component minus maximum negative-going varying signal voltage component) must at least equal the forward conduction or offset voltage of diode 12 ($V_{be}$) to preclude distortion resulting from cutoff of diode 12 and transistor 10. If the direct voltage component of the input signal is greater than the negative-going signal component, the minimum input voltage will exceed this offset voltage. The excess direct voltage will then result in production of a direct current in diode 12 which, in turn, will result in a direct collector current in transistor 10 and a direct voltage drop across resistor 16. In this case, the dynamic range of the output voltage (i.e. the available range of signal variation) is less than the full supply voltage of source 14. The gain must be selected less than that for the case where the minimum input voltage equals the diode offset voltage. The unmodulated direct voltage drop across the resistor 16 causes undesirable power dissipation and a resultant loss in efficiency in the translating stage.

Referring again to the complete circuit diagram of FIG. 1, the above-described shortcoming is overcome by draining from diode 12 the direct current bias (caused by the excess direct input voltage) that gives rise to the unmodulated direct voltage drop across resistor 16. This current drain is provided by a second pair of semiconductor devices 26 and 28 which have characteristics that are substantially the same as those of devices 10 and 12. The two pairs of devices and associated components form a differentially operating configuration which exhibits rejection of commonly applied voltages such as that provided by source 18.

Specifically, the direct voltage component source 18 provides a voltage of a polarity and of sufficient magnitude to forward bias both diode 28 and the base-emitter junction of transistors 26 (i.e. $V_{18}>V_{be_{26}}$). As is described in the above-mentioned U.S. patent application Ser. No. 772,245, a direct current is produced in diode 28 and a substantially equal direct current is demanded in the collector-emitter circuit of transistor 26 by virtue of the fact that the input junctions of diode 28 and transistor 26 are matched and furthermore, they are coupled directly in parallel.

The direct current component supplied to diode 28 is given by the expression:

$$I_{28}=\frac{(V_{18}-V_{bc_{28}})}{R_{30}}$$

where $I_{28}$=the direct current component in diode 28
$V_{18}$=the direct voltage component of source 18
$V_{be_{28}}$=the voltage across diode 28 when it is conducting in the forward direction
$R_{30}$=the resistance of resistor 30.

The direct emitter current demanded by transistor 26 is substantially identical to the current $I_{28}$ as noted above. For transistors of the type normally fabricated by integrated circuit techniques (e.g. $\beta>30$), the collector current of transistor 26 will be substantially equal to its emitter current. Therefore, with the resistance value of resistor 22 equal to or less than that of resistor 30, and the collector electrode 26*c* at the same or a lower voltage as compared with the base electrode 28*b*, the direct current supplied to resistor 22 by source 18 will be sufficient to supply the collector-emitter direct current demand of transistor 26. Where resistors 22 and 30 are of equal value, the direct collector-emitter current of transistor 26 is equal to the direct current in resistor 22. The collector electrode 26*c* is maintained substantially at the voltage $V_{be_{28}}$ since the base electrode 12*b* of diode 12 is connected directly to collector electrode 26*c* thereby preventing increases in voltage at collector electrode 26*c* above the forward conduction voltage of diode 12 ($V_{be_{28}}=V_{be_{12}}$). Furthermore, the value of resistors 22 and 30 is selected sufficiently large with respect to all expected voltage variations of the input source 18, 20 that transistor 26 is not driven into saturation for any input signal conditions.

Where resistor 22 is of a smaller value than resistor 30, the direct current supplied from source 18 to junction point 24 (i.e. current through resistor 22) will exceed the direct collector current demand of transistor 26. The excess of direct current will be supplied to diode 12 and the base-emitter circuit of transistor 10 as bias current. In a particular application, therefore, resistor 22 may differ in value from resistor 30 according to bias requirements of diode 12 and transistor 10.

As stated above in connection with diode 28 and transistor 26, the collector-emitter current of transistor 10 will be substantially equal to the base-emitter current in diode 12. The bias current supplied to diode 12 is selected in relation to the nature of the signal provided by source 20, the relative voltage of supply 14 and the resistances of resistors 22 and 16.

For example, assuming that the source 20 provides a symmetrical alternating voltage waveform (no direct voltage component), it is desirable to bias transistor 10 such that the quiescent voltage at collector electrode 10*c* is substantially one-half the voltage of source 14. Resistors 22 and 30 are selected unequal to provide a desired bias (excess) current to diode 12, which direct current is also produced in the collector circuit of transistor 10. Resistor 16 is then selected equal to the quotient of one-half the voltage provided by source 14 and the desired quiescent collector current in transistor 10. Furthermore, in order to obtain a maximum signal voltage component at collector electrode 10*c,* the ratio of resistors 16 and 22 is selected to satisfy the expression:

$$\frac{R_{16}}{R_{22}}=\frac{V_{14}}{V_{p-p_{20}}}$$

where $V_{14}$=voltage of source 14
$V_{p-p_{20}}$=peak to peak voltage of source 20.

For the case where the signal source 20 provides a varying direct voltage signal, the bias current provided for diode 12 is selected only of sufficient magnitude to insure all signal voltages are reproduced at collector electrode 10*c*. That is, a relatively small bias current is supplied to diode 12 and the quiescent voltage at collector electrode 10*c* is almost equal to $V_{14}$. The ratio $R_{16}/R_{22}$ is selected according to the expression specified above. The signal voltage gain of the total configuration is equal to $R_{16}/R_{22}$.

It can be seen from the above discussion that the circuit shown in FIG. 1 has the capability of providing an output signal at collector electrode 10*c* which is independent of the magnitude of all or any undesired portion of the direct voltage component provided by source 18.

On the other hand, the varying voltage signal component provided by source 20 is amplified at collector electrode 10*c*. The direct voltage level of the amplified voltage at collector electrode 10*c* may be selected by appropriate choice of value for resistors 16, 22 and 30 with respect to the operating voltage as set forth above.

Referring to FIG. 2, a modification of the circuit of FIG. 1 is shown wherein bias currents for diode 12 and transistor 10 are derived from the voltage source 14 by means of an additional resistor 32 coupled between source 14 and junction point 24.

In FIG. 2, as well as subsequent figures, devices corresponding to the diode-connected transistors 28 and 12 of FIG. 1 will be shown with the conventional diode symbol. The circuit in FIG. 2 operates in substantially the same manner as the circuit of FIG. 1 with the exception that resistor 32 is selected to provide the desired bias current for diode 12 and transistor 10. In this case, resistors 22 and 30 may be of equal resistance value while resistors 16 and 32 are selected to provide a desired quiescent operating point for transistor 10 (e.g. resistors 16 and 32 are equal for a varying direct voltage signal input provided by source 20). The signal voltage gain of the total configuration is again determined substantially by the ratio $R_{16}/R_{22}$. Greater independence in selection of circuit values is afforded by this configuration. Furthermore, where there is an uncertainty as to the direct voltage component provided by source 18, the circuit of FIG. 2 may be arranged with a stabilized voltage source 14 so that bias currents for diode 12 and transistor 10 are stabilized.

Referring to FIG. 3 of the drawing, a further embodiment of the invention which may be employed where signals from two input sources are to be combined, the combination being referenced to a direct voltage level different from that of the input signals. The specific embodiment relates to the case where oppositely phased (i.e. push-pull) input signals are provided. This configuration may be employed, for example, where it is desired to convert a balanced push-pull input signal to a single-ended output signal with a desired direct voltage level. In FIG. 3, the varying signal component source 20 is coupled across the primary winding 34*a* of a transformer 34 provided with a center-tapped secondary winding 34*b*. Direct voltage component source 18 is connected between a reference voltage (ground) and the center-tap 34*c* of transformer 34. All remaining components shown in FIG. 3 are designated by the same reference numerals as are employed in FIGS. 1 and 2.

In the operation of the circuit shown in FIG. 3, it will be assumed that the resistors 22 and 30 are of equal resistance values while resistor 32 is selected with respect to source 14 to provide sufficient bias current to diode 12 and transistor 10 to insure that both devices are conducting for all expected signal levels in the circuit. Resistor 16 is selected for this case equal to one-half the value of resistor 32 to insure maximum utilization (signal modulation) of the voltage at collector electrode 10*c*.

As described above in connection with FIGS. 1 and 2, substantially equal direct currents are supplied to diode 28 and to the collector-emitter circuit of transistor 26 where the voltage of source 18 is assumed to be greater than the nominal $V_{be}$ of diode 28. Assuming a sinusoidal input voltage waveform is supplied by source 20, when the signal voltage applied to resistor 30 is positive, signal current in addition to the direct current supplied by source 18 is supplied to diode 28 and the base-emitter junction of transistor 26. The increased current in diode 28 is matched by an increase in collector-emitter current of transistor 26, the latter increased current being supplied by a decrease in the bias current supplied via resistor 32 to diode 12. At the same time, the voltage supplied to resistor 22 decreases sinusoidally, further reducing the current which can be supplied via resistor 22 to collector electrode 26*c*. The further deficiency in current available for transistor 26 is also supplied via resistor 32 so as to further reduce the current in diode 12. Thus a reduction in current in diode 12 twice the increase in current in diode 28 is produced. A reduction in current in the collector-emitter circuit of transistor 10 equal to that in diode 12 is produced. An amplified voltage change is therefore produced at collector electrode 10*c*.

For the opposite half-cycle of voltage supplied by source 20, the current in diode 28 decreases, the current in transistor 26 decreases by a like amount and the current in diode 12 increases by twice that amount. The opposite half-cycle of input voltage is therefore similarly amplified.

Various modifications of the circuit shown in FIG. 3 may be made. For example, a second set of four semiconductor devices and associated components identical to those shown may also be coupled across transformer 34. The input signal connections to the second set of devices would, however, be interchanged with respect to those shown so that the output from the second set of devices would be 180° out of phase with respect to the output from the first set. In this manner, the push-pull input signals could be converted to amplified push-pull output signals referenced to a direct voltage level independent of that of the input signals.

A circuit substantially as shown in FIG. 3 may also be employed where it is desired to combine (e.g. subtract) signals from two independent signal sources. In that case, for example, separate primary windings may be coupled to separate secondary windings of two input transformers in place of transformer 34. The separate secondary windings (or any other appropriate independent signal sources) then may be coupled respectively to the first and second input terminals of the signal translating stage such that the difference between the applied input signals is produced across the output impedance with a direct voltage reference level substantially independent of that of the input signals. It should also be noted that for this case separate gains may be selected for each of the independent signal sources, the separate gain being determined by the ratio of the output impedance 16 to the respective input impedances 22 and 30.

Referring to FIG. 4 of the drawing, an integrated circuit arranged for providing the functions of intermediate frequency amplification, video detection, video amplification, intermediate frequency sound amplification and automatic gain control in a television receiver is illustrated partially in block diagram and partially in schematic form.

In FIG. 4, those circuit elements which are fabricated on the integrated circuit chip 44 are enclosed within a dashed line. Operation voltage (B+) is indicated as being supplied from a source external to the chip. For illustrative purposes connecting conductors between several devices on the chip and the external B+ supply have not been shown but rather the point of application of operating voltage to those devices is indicated by the symbol B+. All points internal to the chip which bear the designation B+ are coupled by conductive paths to the single B+ terminal of the chip. Similarly, ground designations have been shown at numerous locations within the chip. External ground connections are provided to terminals at each end of the chip and all points within the chip designated as connected to ground are connected internally on the chip to one or the other of these terminals. For a more detailed description of the physical arrangement of components on the chip, reference may be made to co-pending U.S. patent application Ser. No. 803,544, entitled "Amplifier Circuits" filed in the name of Jack Avins and assigned to the same assignee as the present invention.

In FIG. 4, the intermediate frequency output signal produced by a television tuner is coupled by means of a first frequency selective filter 40 to a first intermediate frequency amplifier 42. Amplified I-F signals produced by amplifier 42 are coupled by means of a second frequency selective filter 46 to directly coupled second and third I-F amplifier stages 48 and 50.

A further output of second frequency selective filter 46 is coupled to a sound I-F mixer-amplifier 52, the output of which is a 4.5 mHz. carrier wave modulated by the accompanying television sound information.

The output of third I-F amplifier 50 is coupled to a base electrode **52*b* of video detector transistor 52 arranged in an emitter follower configuration. A load resistor 54 is coupled between an emitter electrode 52*a* of detector 52 and a point of reference voltage (e.g. ground) by means of a bias modulating transistor 56. A filter capacitor 58 is connected between emitter electrode 52*a* and ground. The output of video detector 52 is coupled by means of a 45 mHz. filter network 60 to the base electrode 62*b* of an emitter follower stage 62. A peaking capacitor 64 is coupled between emitter electrodes 52*a* and 62*a***.

Emitter electrode 62 is connected to a first input terminal 65 of a signal translating stage indicated generally by the reference numeral 66. An impedance network comprising a resistor 67 coupled in parallel with a series video peaking combination of a resistor 68 and a capacitor 70 is coupled between emitter electrode **62*a* and a first circuit junction 72 within signal translating stage 66. A Zener diode 74 is coupled from the junction of capacitor 70 and resistor 68** to ground.

The output of third I-F amplifier 50 is also coupled to a filter network comprising a resistor 76 and a capacitor 78 coupled in series between the output of amplifier 50 and ground. A direct voltage which is developed across capacitor 78 is coupled to a bias reference transistor 80, the emitter electrode **80*a* of which is coupled to the junction of resistor 54 and bias modulating transistor 56. The output of transistor 80 is coupled by means of a 45 mHz. filter network 82 (substantially identical to network 60) to an emitter follower transistor 84. An emitter electrode 84*a* of transistor 84 is connected to a second input terminal 85 of signal translating stage 66. An impedance comprising a resistor 86 is connected between input terminal 85 and a second circuit junction 88 within signal translating stage 66**.

Signal translating stage 66 comprises a first transistor 90 having an emitter electrode **90*a* connected to ground, a collector electrode 90*c* coupled by means of an output load resistor 92 to a source of operating voltage (B+) and a base electrode 90*b* connected to first circuit junction 72. A second semiconductor device illustrated as a diode 94 comprising a base electrode 94*b* and an emitter electrode 94*a* is directly connected between base electrode 90*b* and emitter electrode 90*a*. Diode 94 preferably is fabricated as a transistor identical to transistor 90 but having its collector electrode (not shown) connected directly to base electrode 94*b*. Signal translating stage 66 further comprises third and fourth semiconductor devices shown as a transistor 96 and a diode 98 which bear the same structural and operational relationship to each other as do devices 90 and 94. Transistor 96 comprises an emitter electrode 96*a* directly connected to ground, a collector electrode 96*c* connected to a first circuit junction 72 (i.e. the junction of resistor 67 and base electrode 90*b*) and a base electrode 96*b* connected to second circuit junction 88 (i.e. one end of resistor 86). Diode 98 comprises an emitter electrode 98*a* connected to emitter electrode 96*a* and a base electrode 98*b* connected to base electrode 96*b* at second circuit junction 88**.

The output of signal translating stage 66 which is developed at collector electrode **90*c* is directly connected to a video amplifier transistor 100. Video amplifier transistor 100 is supplied with bias current by means of a current source 102 coupled to emitter electrode 100*a* through a resistor 104. Amplified video and synchronizing signal components of the detected composite television signal are produced at emitter electrode 100*a* and are coupled to further video amplifier stages and a synchronizing signal separator circuit as is customary in television receivers. Video amplifier transistor 100 also supplies video signals to a keyed automatic gain control detector 106 and a noise elimination circuit 108. Keying pulses are coupled to noise circuit 108 and AGC detector 106 from the horizontal deflection circuit of the television receiver. AGC detector 106** provides gain control for the I-F and tuner amplifiers in a manner described in detail in a co-pending U.S. patent application Ser. No. 803,590, entitled "Automatic Gain Control Circuit" filed in the name of Jack R. Harford and assigned to the same assignee as the present invention.

In the operation of the circuit illustrated in FIG. 4, amplified I-F signals are produced at the output of third I-F amplifier 50 and are applied to base electrode **52*b* of video detector 52. Furthermore, since I-F amplifiers 48 and 50 and detector 52 are directly coupled one to another in the order named and are coupled to a common operating voltage source (B+), a substantial undesired direct voltage component is also produced at the base electrode 52*b* of detector 52. The undesired direct voltage component is removed by means of signal translating stage 66** as will be explained below.

The I-F signal component of the voltage produced at base electrode **52*b* is filtered by means of resistor 76 and capacitor 78 so that substantially the entire undesired direct voltage component (e.g. 5.5 volts) appears across capacitor 78. The direct voltage component across capacitor 78 reduced by the base-emitter voltage drop (e.g. 0.6 volt) of transistor 80 appears at the junction of emitter electrode 80*a* and resistor 54. Similarly, the undesired direct voltage component at base electrode 52*b* reduced by the base-emitter voltage drop of detector transistor 52 appears at the junction of emitter electrode 52*a* and resistor 54. The direct voltage at emitter electrode 80*a* is slightly less than that at emitter electrode 52*a* such that a small bias current (of the order of 50 microamperes) is supplied to emitter electrode 52*a* via resistor 54 (e.g. 4000 ohms). Video detector transistor 52** is thereby arranged for linear response to I-F signals down to very low levels as is explained in detail in co-pending United States patent application Ser. No. 803,920 entitled "Detector Circuits," filed in the name of Jack R. Harford and assigned to the same assignee as the present invention.

The direct voltage component produced at emitter electrode **80*a*, reduced by an additional base-emitter voltage drop of transistor 84 is produced at second input terminal 85 of signal translating stage 66. Similarly, the undesired direct voltage component reduced by the base-emitter voltage of detector 52 and the detected video signal produced at emitter electrode 52*a* are coupled to emitter-follower transistor 62. The direct voltage component, further reduced by the base-emitter voltage drop of transistor 62, along with the detected video signals are produced at first input terminal 65. As will be explained below, signal translating stage 66 is arranged to reject or remove those voltage components which are common to input terminals 65 and 85 and to amplify those voltage components which appear at only one input terminal. Specifically, the undesired direct voltage component which corresponds to the direct voltage component at the output of third I-F amplifier 50 is removed while the detected video signal component produced at the output of video detector 52 is amplified and coupled to video amplifier transistor 100 by signal translating stage 66**.

Signal translating stage 66 operates in substantially the same manner as the circuit shown in FIG. 1. The undesired direct voltage component source represented in FIG. 1 by battery 18 corresponds to the direct voltage produced at the output of third I-F amplifier 50 and coupled via transistors 62 and 84 to input terminals 65 and 85, respectively, in FIG. 4. The desired varying signal source 20 of FIG. 1 corresponds to the video detector transistor 52 which provides video signal components via transistor 62 to input terminal 65. In FIG. 4, the undesired direct voltage component provided at input terminal 85 produces a direct current in resistor 86 and in diode 98. A substantially equal direct collector current is demanded by transistor 96. This latter current is supplied by means of the undesired direct voltage component provided at input terminal 65. Resistor 67 is selected slightly less than resistor 86 (e.g. 1980 ohms as compared to 2000 ohms) so as to provide a direct bias current to diode 94 and to the base-emitter junction of transistor 90. This bias current insures conduction of diode 94 and transistor 90 in response to low level video signal components.

The video signal components provided at input terminal 65 produce current variations in diode 94 and the input (base-emitter) circuit of transistor 90. A varying voltage corresponding to the video signal component is therefore produced at collector electrode **90*c*. The video signal voltage at collector electrode 90*c* is substantially equal to the corresponding voltage at input terminal 65 multiplied by the ratio $R_{92}/R_{67}$ (the signal gain of translating stage 66). Typically, resistor 92 is of the order of 8000 ohms, thereby providing a video signal voltage gain of approximately four in translating stage 66. Since the input bias supplied to transistor 90** is relatively small, the output video signal voltage may vary substantially between B+ and ground with substantially no undesired direct voltage component.

The operation of modulating bias transistor 56 is explained in detail in the above-identified United States patent application Ser. No. 803,920. For purposes of the present explanation, it is sufficient to note that transistor 56 responds to video signal representative current supplied via resistor 67 so as to maintain bias reference transistor 80 conductive for all expected video signal levels at video detector 52. The maximum video signal level at the output of video detector 52 is maintained at a desired level by the operation of the AGC circuit of the television receiver.

What is claimed is:

1. A signal translating stage comprising first and second pairs of semiconductor devices, each said pair comprising a first device having first, second and third electrodes and a second device having at least first and second electrodes, the two devices in a pair having substantially proportionally related conduction characteristics, said first electrodes in each said pair being coupled to each other, first input circuit means having a first impedance for supplying input signals including undesired and desired components coupled to said second electrodes of each said device of said first pair and to said third electrode of said first device of said second pair, second input circuit means having a second impedance for supplying at least a portion of said first input signals including said undesired component coupled to said second electrodes of each device of said second pair, and output circuit means comprising an output impedance adapted for coupling a source of energizing voltage to said third electrode of said first device of said first pair for deriving translated signals from which said undesired component is removed.

2. A signal translating stage according to claim 1 and further comprising means for supplying biasing voltages coupled between said first and second electrodes of each said device such that, in each pair, proportionally related direct current components flow in circuit means coupled to said third electrode of said first device and said second electrode of said second device.

3. A signal translating stage according to claim 2 wherein both devices in each pair are disposed in the same integrated circuit, and each said first device comprises a transistor and each said second device comprises a diode.

4. A signal translating stage according to claim 3 wherein said first, second and third electrodes correspond respectively to emitter, base and collector electrodes.

5. A signal translating stage according to claim 4 wherein said second device of each said pair further comprises a collector electrode directly connected to its base electrode.

6. A signal translating stage according to claim 4 wherein said means for supplying biasing voltage to said first pair comprises a biasing resistor coupled between said source of energizing voltage and said base electrodes of said first pair.

7. A signal translating stage according to claim 5 wherein said undesired component comprises a substantially constant direct voltage and said desired component comprises a varying signal voltage.

8. A signal translating stage according to claim 7 wherein said substantially constant direct voltage is greater than the forward conduction base-emitter voltage drop of said first transistor of said second pair.

9. A signal translating stage according to claim 5 wherein said first, second and output impedances are resistors, the voltage gain of said translating stage being proportional to the ratio of resistance of said output and first resistors.

10. A signal translating stage according to claim 9 wherein said first and second resistors are substantially equal.

11. A signal translating stage according to claim 9 wherein the ratio of resistances of said output and first resistors is selected approximately equal to the ratio of said energizing voltage and the maximum excursion of said desired component.

References Cited

UNITED STATES PATENTS

| | | | |
|---|---|---|---|
| 3,214,706 | 10/1965 | Mollinga | 330—19X |
| 3,273,060 | 9/1966 | Schneider | 330—30X |

ROY LAKE, Primary Examiner

L. J. DAHL, Assistant Examiner

U.S. Cl. X.R.

330—24

UNITED STATES PATENT OFFICE
CERTIFICATE OF CORRECTION

Patent No. 3,564,438 Dated Feb. 16, 1971

Inventor(s) Allen LeRoy Limberg

It is certified that error appears in the above-identified patent and that said Letters Patent are hereby corrected as shown below:

Column 1, line 34, that portion reading "transulating" shoulc read --translating--. Column 7, line 43, that portion readir "Operation" should read --Operating--. Column 10, line 37, after "first", insert --and second--; line 38, after "trodes' insert --of said devices--, delete "each" (first occurrence), after "said", insert --first--, delete "to each"; line 39, delete "other," and insert --in parallel relation and saia first and second electrodes of said devices in said second pair being coupled in parallel relation,--.

Signed and sealed this 29th day of June 1971.

(SEAL)
Attest:

EDWARD M.FLETCHER,JR.
Attesting Officer

WILLIAM E. SCHUYLER, JR.
Commissioner of Patents